United States Patent
Srinivasan

(10) Patent No.: US 10,048,315 B2
(45) Date of Patent: Aug. 14, 2018

(54) STUCK-AT FAULT DETECTION ON THE CLOCK TREE BUFFERS OF A CLOCK SOURCE

(71) Applicant: STMicroelectronics International N.V., Amsterdam (NL)

(72) Inventor: Venkata Narayanan Srinivasan, Gautam Budh Nagar District (IN)

(73) Assignee: STMicroelectronics International N.V., Schiphol (NL)

( * ) Notice: Subject to any disclaimer, the term of this patent is extended or adjusted under 35 U.S.C. 154(b) by 57 days.

(21) Appl. No.: 15/203,362

(22) Filed: Jul. 6, 2016

(65) Prior Publication Data

US 2018/0011141 A1  Jan. 11, 2018

(51) Int. Cl.
  *G01R 31/28* (2006.01)
  *G01R 31/317* (2006.01)
  *G01R 31/3185* (2006.01)

(52) U.S. Cl.
  CPC .. *G01R 31/31723* (2013.01); *G01R 31/31727* (2013.01); *G01R 31/31855* (2013.01); *G01R 31/318552* (2013.01)

(58) Field of Classification Search
  CPC .......... G01R 31/3177; G01R 31/31723; G01R 31/31727; G01R 31/31725
  See application file for complete search history.

(56) References Cited

U.S. PATENT DOCUMENTS

| | | | | |
|---|---|---|---|---|
| 8,542,177 B2* | 9/2013 | Lee | ...... | G09G 3/3688 345/99 |
| 2010/0332929 A1* | 12/2010 | Branch | ...... | G01R 31/318536 714/731 |
| 2013/0103994 A1* | 4/2013 | Tekumalla | ...... | G01R 31/318594 714/726 |
| 2014/0101505 A1* | 4/2014 | Tekumalla | ...... | G01R 31/318552 714/729 |
| 2016/0028381 A1* | 1/2016 | Tasher | ...... | G06F 1/10 327/292 |

* cited by examiner

*Primary Examiner* — Thien Nguyen
(74) *Attorney, Agent, or Firm* — Crowe & Dunlevy

(57) ABSTRACT

A first clock signal and second clock signal are generated by first and second clock circuits, respectively. A multiplexer selects between the first clock signal and second clock signal to produce a scan clock signal. A non-scan flip flop clocks a data input through to a data output in response to the second clock signal. A scan chain includes a scan flip flop configured to capture the data output from the non-scan flip flop in response to the scan clock signal. The logic state of the captured data in the scan flip flop of the scan chain is indicative of whether the second clock circuit has a stuck-at fault condition (for example, with respect to any one or more included buffer circuits).

22 Claims, 4 Drawing Sheets

STUCK-AT FAULT DETECTION ON THE CLOCK TREE BUFFERS OF A CLOCK SOURCE

TECHNICAL FIELD

The present invention relates to test circuitry for integrated circuit devices and, in particular, to test circuitry used to test for a stuck-at fault condition with respect to clock tree buffers of a clock source. The clock source is preferably a clock source which is not an automated test pattern generator (ATPG) clock source.

BACKGROUND

Automated testing systems for integrated circuit devices are well known to those skilled in the art. Such systems may be used to test for a number of different types of faults. One common fault of interest for testing is the so called "stuck-at" fault in which the output of a logic circuit is persistently stuck in a certain logic state regardless of change in input. The detection of such stuck-at faults is of significant interest with respect to clock circuits, such as clock trees and clock generators, as the overall circuit operation will typically fail in the absence of a controlling clock signal. There is a need in the art for test circuitry operable to detect, for example by implication, a stuck-at fault condition of a buffer circuit within a clock tree.

SUMMARY

In an embodiment, a circuit comprises: a first clock source generating a first clock signal; a first clock tree through which the first clock signal propagates; a second clock source generating a second clock signal; a second clock tree through which the second clock signal propagates; a multiplexer circuit having a first input coupled to an output of the first clock tree and a second input coupled to an output of the second clock tree; a non-scan flip flop having a data input coupled to receive an input signal and a clock input coupled to the output of the second clock tree; and a scan chain having a first scan flip flop with a data input coupled to an output of the non-scan flip flop, a scan input coupled to a test input and a clock input coupled to an output of the multiplexer.

In an embodiment, a circuit comprises: a first clock circuit configured to generate a first clock signal; a second clock circuit configured to generate a second clock signal; a multiplexer circuit having a first input coupled to receive the first clock signal and a second input coupled to receive the second clock signal; a non-scan flip flop having a data input coupled to receive an input signal and a clock input coupled to receive the second clock signal; and a scan chain having a first scan flip flop with a data input coupled to an output of the non-scan flip flop, a scan input coupled to receive a test input and a clock input coupled to receive a scan clock signal output from the multiplexer.

In an embodiment, a method comprises: generating a first clock signal; generating a second clock signal; selecting between the first clock signal and second clock signal to produce a scan clock signal; clocking a data input through a non-scan flip flop in response to the second clock signal; and capturing data output from the non-scan flip flop in one or more scan flip flops of a scan chain in response to the scan clock signal.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 1:
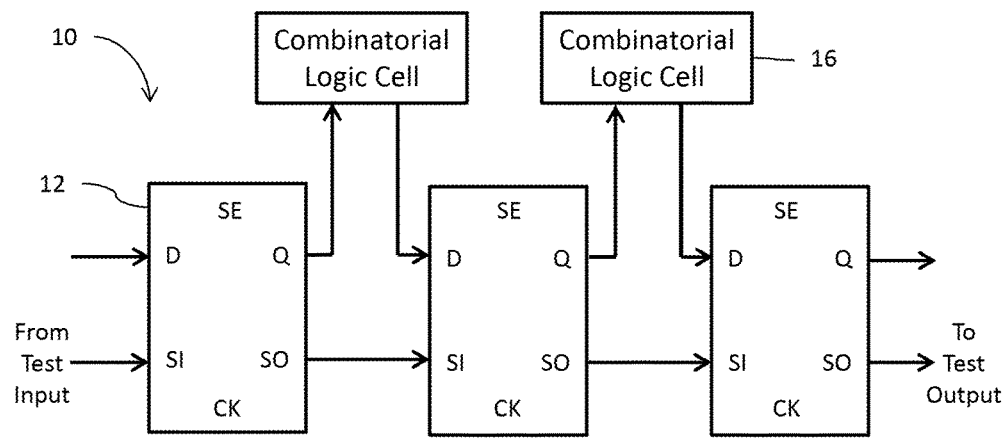
FIG. 1 is a block diagram of a scan chain.

Reference is now made to FIG. 1 showing a block diagram of a scan chain 10 formed by a plurality of scan chain cells, wherein each cell comprises a flip-flop 12. Each flip-flop 12 includes a data input (D) and a scan input (SI). Each flip-flop 12 further includes a data output (Q) and a scan output (SO). Each flip-flop 12 is further configured to receive a same clock signal at a clock input (CK). The mode of operation of each flip-flop 12 is controlled by a scan enable signal applied to the scan enable (SE) input of each flip-flop 12. When scan enable is in a first logic state, the flip-flop 12 responds to the clock signal by shifting the data received at the scan input (SI) to the data output (Q) and scan output (SO), this is referred to as the shift mode of operation. When scan enable is in a second logic state, the flip-flop 12 responds to the clock signal by shifting the data received at the data input (D) to the data output (Q) and scan output (SO), this is referred to as the capture mode of operation.

In the scan chain 10, the scan output (SO) of one flip-flop 12 is coupled to the scan input (SI) of the next successive flip-flop 12 in the scan chain 10 (i.e., is coupled to the next cell in the series of cells making up the scan chain). The scan input (SI) of the first flip-flop 12 in the scan chain 10 is coupled to receive test data from a test input. The scan output (SO) of the last flip-flop 12 in the scan chain 10 is coupled to output test result data to a test output. The data output (Q) of one flip-flop 12 is coupled to an input of a combinatorial logic cell 16 that is being tested. The combinatorial logic cell 16 includes a number of interconnected logic circuits designed to perform one or more functional operations. An output of the combinatorial logic cell 16 is coupled to the data input (D) of the next successive flip-flop 12 in the scan chain 10 (i.e., is coupled to the next cell in the series of cells making up the scan chain). The data input (D) of the first flip-flop 12 in the scan chain 10 may be configured to receive a signal from another hardware function on the chip or a chip-level input pad. The data output (Q) of the last flip-flop 12 in the scan chain 10 is typically used to either drive the input of another hardware function on the chip or a chip-level output pad.

Figure 2:
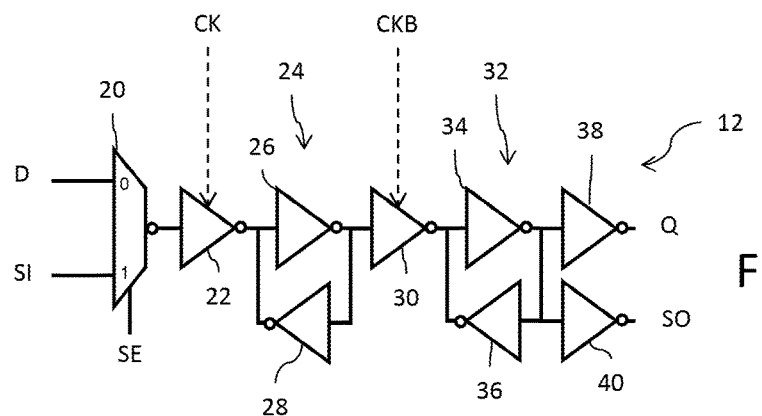
FIG. 2 is a circuit design for an example scan chain flip-flop.

The flip-flop 12 may have any suitable circuit design. FIG. 2 shows the circuit design for one non-limiting example of the flip-flop 12. The flip-flop 12 includes a multiplexer 20 having inputs coupled to the data input (D) and the scan input (SI). The multiplexer 20 selects one of those inputs for inverted output in response to the logic state of the scan enable (Scan-En) signal. A clocked inverter 22 has an input coupled to the output of the multiplexer 20. The clocked inverter 22 is controlled by the clock signal (CK). A first latch 24 is formed by cross-coupled inverters 26 and 28 and has an input coupled to the output of the clocked inverter 22. A clocked inverter 30 has an input coupled to the output of the first latch 24. The clocked inverter 30 is controlled by the logical inverse of the clock signal (CKB).

A second latch 32 is formed by cross-coupled inverters 34 and 36 and has an input coupled to the output of the clocked inverter 30. A first output inverter 38 has an input coupled to the output of the second latch 32 and provides the data output (Q). A second output inverter 40 has an input coupled to the output of the second latch 32 and provides the scan output (SO).

Figure 3:
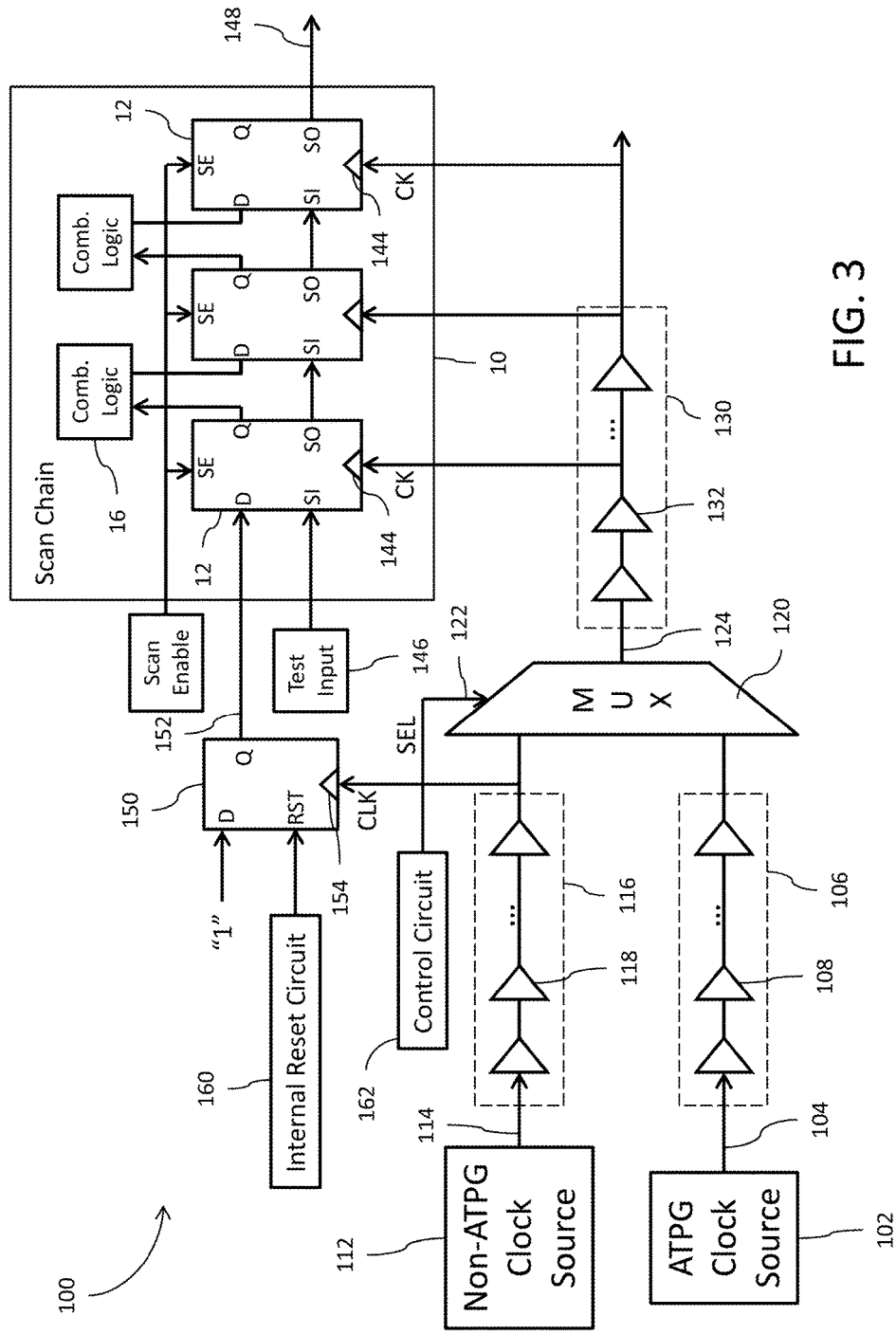
FIG. 3 is a block diagram of a testing circuit.

Reference is now made to FIG. 3 showing a block diagram of a testing circuit 100. The testing circuit 100 includes a first clock source 102 generating a first clock signal 104 and a second clock source 112 generating a second clock signal 114. In this embodiment, the first clock source 102 comprises an automated test pattern generator (ATPG) clock source. The ATPG clock source is used in ATPG scan shift and/or scan capture and is a controlled clock source (i.e., if it is a clock from a pad then it is driven by automated test equipment (ATE) as mentioned in pattern or if it is an internal clock source, like a phase locked loop (PLL) used for at-speed testing during transition pattern capture, then the internal clock source output will be connected to an on chip clock controller (OCC) which takes the free running clock output as its input and generates a specific of clock pulses to be output based on a test information). The second clock source 112 comprises a non-ATPG clock source. A non-ATPG clock source is not used during ATPG operations and, contrary to the ATPG clock source, is an uncontrolled clock source (for example, an analog block output directly going to a MUX (not through the OCC) or if from a pad but not including information about the clock in the pattern.

The first clock signal 104 is applied to the input of a first clock tree 106 that includes at least one buffer circuit 108, and typically includes a plurality of buffer circuits 108 coupled in series with each other. The second clock signal 114 is applied to the input of a second clock tree 116 that includes at least one buffer circuit 118, and typically includes a plurality of buffer circuits 118 coupled in series with each other. The first and second clock trees 106 and 116 may each further include divider circuits to divide the frequencies of the first and second clock signals 104 and 114, respectively, if desired. It will be noted that in typical operation any divider circuits on the first clock tree 106 (from the ATPG clock source 102) are bypassed during scan shift as it will be directly driven from the ATE. Also, during scan capture any dividers on the first clock tree 106 are bypassed if driven by the ATE. Typically, dividers are only used if an internal clock source, like a PLL, is used for scan capture.

A multiplexer circuit 120 has a first input coupled to an output of the first clock tree 106 and a second input coupled to the output of the second clock tree 116. A control input 122 of the multiplexer circuit 120 receives a selection signal (SEL) whose logic state controls the operation of the multiplexer circuit to connect a selected one of the first and second inputs to an output 124 of the multiplexer circuit. So, responsive to the SEL having a first logic state, the multiplexer circuit 120 passes the first clock signal 104 output from the first clock tree 106 to the output 124. Conversely, responsive to the SEL having a second logic state, the multiplexer circuit 120 passes the second clock signal 114 output from the second clock tree 116 to the output 124. The clock signal output from the multiplexer circuit 120 is referred to as the scan chain clock signal CK. The scan chain clock signal CK is applied to the input of a third clock tree 130 that includes at least one buffer circuit 132, and typically includes a plurality of buffer circuits 132 coupled in series with each other.

The testing circuit 100 further includes a scan chain 10 of the type shown in FIG. 1. The scan chain 10 includes a plurality of scan chain flip flops 12 coupled in series. Each flip flop 12 includes a clock input 144 coupled to receive the scan chain clock signal CK. The scan output (SO) of one flip flop 12 is coupled to the scan input (SI) of the next flip flop 12 of the scan chain 10. The scan input (SI) of the first flip-flop 12 in the scan chain 10 is coupled to receive test data from a test input 146. The test input 146 could, for example, be a scan output (SO) of flip-flop of some other scan chain or a signal from a chip level input pad driven by the ATE during scan shift. The scan output (SO) of the last flip-flop 12 in the scan chain 10 is coupled to output test result data to a test output 148.

The testing circuit 100 still further includes a flip flop 150 that is not part of any scan chain (i.e., is not part of scan chain 10 or other scan chains on the integrated circuit chip). The flip flop 150 is accordingly a non-scan flip flop. The flip flop 150 has a data input D coupled to receive an input logic state signal. In an embodiment, the input logic state signal is a logic "1" signal. The flip flop 150 further includes a data output Q coupled to the data input (D) of the first flip-flop 12 in the scan chain 10. The flip flop 150 generates an output signal 152. A clock input 154 of the flip flop 150 is coupled to receive the second clock signal 114 (CLK) generated by the second clock source 112 after having passed through the second clock tree 116. The flip flop 150 further includes a reset input (RST) configured to receive a reset signal, the flip flop 150 responds to assertion of the reset signal by setting the data output Q of the flop flip 150 to a reset logic state. In an embodiment, the reset logic state is logic "0".

An internal reset circuit 160 is provided to generate the reset signal for application to the RST input of the flip flop 150 so as to cause the setting of the data output Q to the reset logic state "0". A control circuit 162 generates the select signal (SEL) to control the selection operation of the multiplexer 120 in choosing between the first and second clock signals for output as the scan chain clock signal CK.

With respect to test mode operation, those skilled in the art will note that the buffer circuits 132 of the third clock tree 130 are covered under the "detected by implication" category of the automatic test pattern generation. The buffer circuits 108 of the first clock tree 106 are covered by way of the first clock source 102 comprising an automated test pattern generator (ATPG) clock source. Testing of the buffer circuits 118 of the second clock tree 116 is provided through the non-scan flip flop 150 and scan chain 10 circuitry under the "detected by implication" category.

The goal is to be able to test for the stuck-at fault condition of any of the buffer circuits 118 of the second clock tree 116. The reset circuit 160 asserts the reset signal applied to the RST input of the non-scan flip flop 150 (reference 180, FIGS. 4 and 5), and this forces the data output Q (152) of the non-scan flip flop 150 to the reset logic state of logic "0" (reference 182, FIGS. 4 and 5). This operation may, for example, be performed at power up. The reset circuit 160 then releases assertion of the reset signal just before or when the test controller operation begins (reference 184, FIGS. 4 and 5). The control circuit 162 which is part of the test controller controls the logic state of the select signal SEL to cause the multiplexer 120 to choose the first input to pass the first clock signal 104 generated by the first clock source 102 as the scan chain clock signal CK (reference 186, FIGS. 4 and 5).

Figure 4:
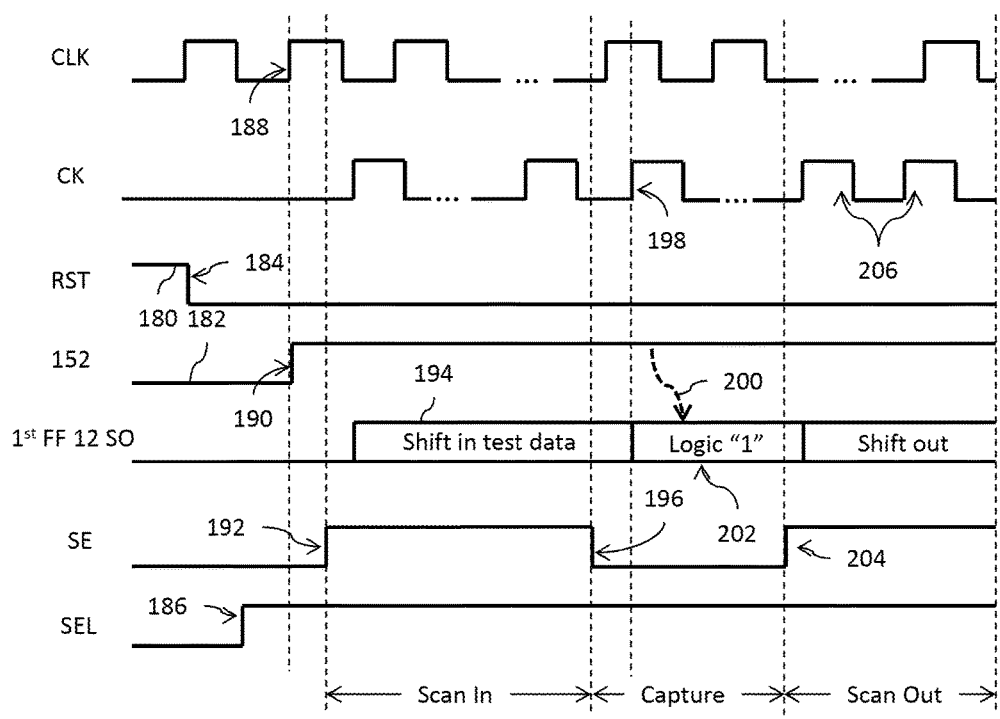
FIGS. 4-5 are timing diagrams showing operation of the testing circuit of FIG. 3.

If there is no stuck-at fault for any of the buffer circuits 118 of the second clock tree 116, the non-scan flip flop 150 will respond to the change in logic state of the clock signal CLK (reference 188, FIG. 4) by passing the input logic state "1" signal at the data input D to the data output Q (reference 190, FIG. 4). The scan in phase of testing starts with the assertion of the scan enable signal SE (reference 192, FIG. 4). The scan chain 10 responds to the scan chain clock signal CK to shift in test data from the test input 146 (reference 194, FIGS. 4 and 5). The values of the test data sequentially appear on the data output Q and scan output SO of the first flip flop 12 (it will be understood that this test data is not relevant to the testing of the second clock tree 116). The scan in phase of testing ends with the deassertion of the scan enable signal SE (reference 196, FIG. 4).

With the scan enable signal SE now deasserted, the scan chain 10 enters the capture phase. The first flip flop 12 of the scan chain 10 responds to the change in logic state of the scan chain clock signal CK (reference 198, FIG. 4) by capturing the logic state "1" data (reference 200, FIG. 4) which then appears on the data output Q and scan output SO of the first flip flop 12 (reference 202, FIG. 4). The other flip flops 12 of the scan chain 10 will capture the data output from the combinatorial logic 16 that is generated in response to receipt of the test data which was previously scanned in at reference 194. The capture phase of testing ends with the assertion of the scan enable signal SE (reference 204, FIG. 4). At this point in time, the first flip flop stores data output from the non-scan flip flop 150.

With the scan enable signal SE now asserted, the scan out phase of testing begins. The flip flops 12 of the scan chain 10 respond to the change in logic state of the scan chain clock signal CK (reference 206, FIG. 4) by serially shifting out the captured data. This will include the captured logic state "1" data (references 200 and 202) from the non-scan flip flop 150, and this data can be observed on the ATE to confirm by implication that the buffer circuits 118 of the second clock tree 116 are operating properly. As understood in the art, the shifting out of the captured data may be accompanied by the shifting in of new test data from test input 146 (as indicated at reference 194).

Figure 5:
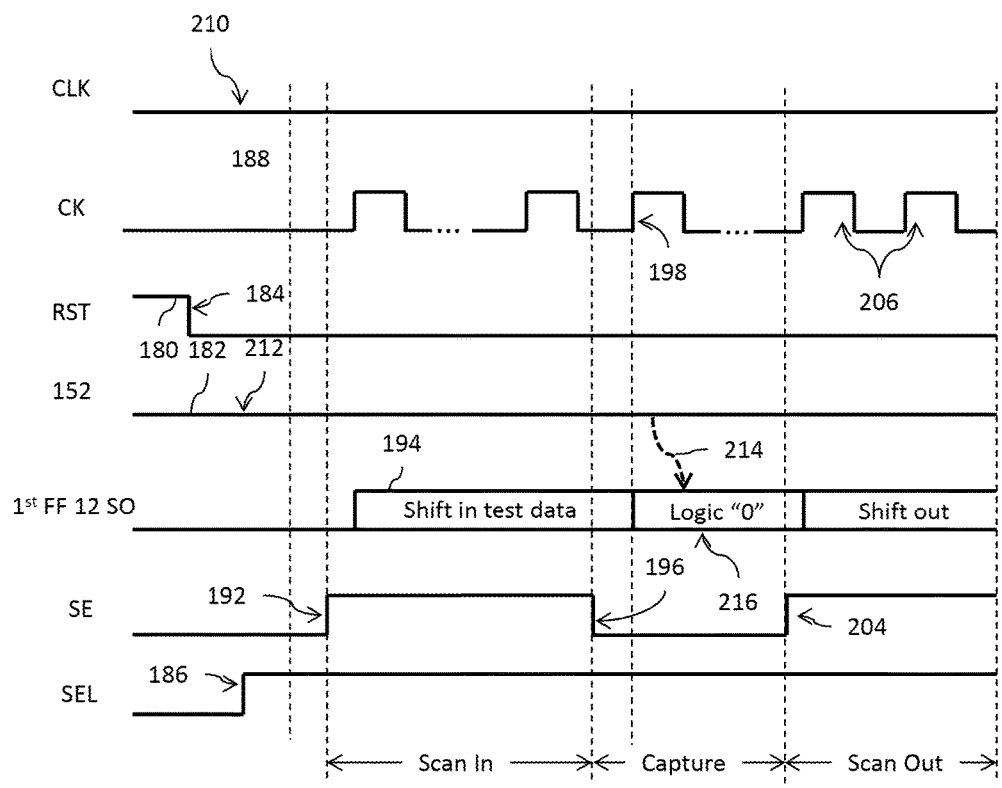

In the event one or more of the buffer circuits 118 of the second clock tree 116 has a stuck-at fault, there will be no change in logic state of the clock signal CLK (reference 210, FIG. 5) and the data output Q of the non-scan flip flop 150 will remain at the reset logic state "0" (reference 212, FIG. 5). After the scan in phase of testing has been completed with the deassertion of the scan enable signal SE at reference 196, the scan chain 10 enters the capture phase. The first flip flop 12 of the scan chain 10 responds to the change in logic state of the scan chain clock signal CK (reference 198, FIG. 5) by capturing the logic state "0" data (reference 214, FIG. 5) which then appears on the data output Q and scan output SO of the first flip flop 12 (reference 216, FIG. 5). The other flip flops 12 of the scan chain 10 will capture the data output from the combinatorial logic 16 in response to the test data which was previously scanned in at reference 194. The capture phase of testing ends with the assertion of the scan enable signal SE (reference 204, FIG. 5). At this point in time, the first flip flop stores data output from the non-scan flip flop 150.

With the scan enable signal SE now asserted, the scan out phase of testing begins. The flip flops 12 of the scan chain 10 respond to the change in logic state of the scan chain clock signal CK (reference 206, FIG. 5) by serially shifting out the captured data. This will include the captured logic state "0" data (references 214 and 216) from the non-scan flip flop 150, and this data can be observed on the ATE to confirm by implication the stuck-at fault condition of one or more of the buffer circuits 118 of the second clock tree 116. As understood in the art, the shifting out of the captured data may be accompanied by the shifting in of new test data from test input 146 (as indicated at reference 194).

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A circuit, comprising:
   a first clock source generating a first clock signal;
   a first clock tree through which the first clock signal propagates;
   a second clock source generating a second clock signal;
   a second clock tree through which the second clock signal propagates;
   a multiplexer circuit having a first input coupled to an output of the first clock tree and a second input coupled to an output of the second clock tree;
   a non-scan flip flop having a data input coupled to receive an input signal and a clock input coupled to the output of the second clock tree; and
   a scan chain having a first scan flip flop with a data input coupled to an output of the non-scan flip flop, a scan input coupled to a test input and a clock input coupled to an output of the multiplexer.

2. The circuit of claim 1, wherein the scan chain further includes:
   a combinatorial logic cell having an input coupled to a data output of the first scan flip flop; and
   a second scan flip flop with a data input coupled to an output of the combinatorial logic cell, a scan input coupled to a scan output of the first scan flip flop and a clock input coupled to the output of the multiplexer.

3. The circuit of claim 1, wherein the non-scan flip flop further includes a reset input, said non-scan flip flop configured to reset the output of the non-scan flip flop to a reset logic state in response to a reset signal received at the reset input.

4. The circuit of claim 3, further including a reset circuit configured to generate the reset signal in advance of a testing operation.

5. The circuit of claim 4, further including a control circuit configured to control operation of the multiplexer circuit to pass the first clock signal output of the multiplexer during the testing operation.

6. The circuit of claim 5, wherein the first scan flip flop of the scan chain is configured to respond to the passed first clock signal output of the multiplexer by capturing the output of the non-scan flip flop.

7. The circuit of claim 6, wherein the captured output of the non-scan flip flop has the reset logic state which indicates detection of a stuck-at fault condition of the second clock tree and has a logic state of the input signal which indicates detection of a no stuck-at fault condition of the second clock tree.

8. The circuit of claim 1, wherein the first clock source is an automated test pattern generator (ATPG) clock source and the second clock source is a non-ATPG clock source.

9. The circuit of claim 1, wherein the first scan flip flop of the scan chain is configured to respond to a scan clock signal output by the multiplexer by capturing the output of non-scan flip flop.

10. The circuit of claim 8, wherein the captured output of the non-scan flip flop has a reset logic state which indicates detection of a stuck-at fault condition of the second clock tree and has a logic state associated with the input signal which indicates detection of a no stuck-at fault condition of the second clock tree.

11. A circuit, comprising:
a first clock circuit configured to generate a first clock signal;
a second clock circuit configured to generate a second clock signal;
a multiplexer circuit having a first input coupled to receive the first clock signal and a second input coupled to receive the second clock signal;
a non-scan flip flop having a data input coupled to receive an input signal and a clock input coupled to receive the second clock signal; and
a scan chain having a first scan flip flop with a data input coupled to an output of the non-scan flip flop, a scan input coupled to receive a test input and a clock input coupled to receive a scan clock signal output from the multiplexer.

12. The circuit of claim 11, wherein the scan chain further includes:
a combinatorial logic cell having an input coupled to a data output of the first scan flip flop; and
a second scan flip flop with a data input coupled to an output of the combinatorial logic cell, a scan input coupled to a scan output of the first scan flip flop and a clock input coupled to the output of the multiplexer.

13. The circuit of claim 11, wherein the multiplexer is configured to selectively pass one of the first clock signal and second clock signal to provide the scan clock signal.

14. The circuit of claim 13, wherein the first clock signal is selectively passed during a testing operation and the first scan flip flop of the scan chain is configured to respond to the scan clock signal by capturing the output of non-scan flip flop.

15. The circuit of claim 14, wherein the captured output of the non-scan flip flop has a first logic state associated with the input signal which indicates detection of a no stuck-at fault condition of the second clock circuit and has a second logic state which indicates detection of a stuck-at fault condition of the second clock circuit.

16. The circuit of claim 14, wherein the non-scan flip flop further includes a reset input, said non-scan flip flop configured to reset the output of the non-scan flip flop to a reset logic state in response to a reset signal received at the reset input prior to said testing operation.

17. The circuit of claim 11, wherein the first clock circuit includes an automated test pattern generator (ATPG) clock source and the second clock circuit includes a non-ATPG clock source.

18. The circuit of claim 11, wherein the first clock circuit includes a first plurality of buffer circuits and the second clock circuit includes a second plurality of buffer circuits.

19. The circuit of claim 18, wherein the first scan flip flop of the scan chain is configured to respond to the scan clock signal by capturing the output of non-scan flip flop, and wherein the captured output of the non-scan flip flop has a first logic state associated with the input signal which indicates detection of a no stuck-at fault condition within the second plurality of buffer circuits and has a second logic state which indicates detection of a stuck-at fault condition within the second plurality of buffer circuits.

20. The circuit of claim 11, wherein the input signal is a fixed logic state signal.

21. The circuit of claim 1, wherein the input signal is a fixed logic state signal.

22. A circuit, comprising:
a first clock source generating a first clock signal;
a first clock tree through which the first clock signal propagates;
a second clock source generating a second clock signal;
a second clock tree through which the second clock signal propagates;
a multiplexer circuit having a first input coupled to receive the first clock signal from the first clock tree and a second input coupled to receive the second clock signal from the second clock tree, the multiplexer configured to output a scan clock signal;
a non-scan flip flop having a data input coupled to receive a signal at fixed first logic state, a reset input coupled to receive a reset control signal, and a clock input coupled to receive the second clock signal, said non-scan flip flop configured to generate an output signal in response to the second clock signal, said output signal having the first logic state when the reset control signal is deasserted and having a fixed second logic state when the reset control signal is asserted; and
a scan chain having a first scan flip flop with a data input coupled to receive the output signal from the non-scan flip flop, a scan input coupled to receive a test data signal, a clock input coupled to receive the scan clock signal and a scan enable input coupled to receive a scan enable signal, the first scan flip flop configured to couple the scan input to both a data input and a scan output of the first scan flip flop in response to deassertion of the scan enable signal and to couple the data input to both the data input and the scan output of the first scan flip flop in response to deassertion of the scan enable signal.

* * * * *